United States Patent [19]

Reid et al.

[11] Patent Number: 5,009,476
[45] Date of Patent: Apr. 23, 1991

[54] SEMICONDUCTOR LAYER WITH OPTICAL COMMUNICATION BETWEEN CHIPS DISPOSED THEREIN

[75] Inventors: Lee R. Reid, Plano; Han-Tzong Yuan, Dallas, both of Tex.

[73] Assignee: Texas Instruments Incorporated, Dallas, Tex.

[21] Appl. No.: 571,044

[22] Filed: Jan. 16, 1984

[51] Int. Cl.$^5$ .......................... G02B 6/12; H01L 31/12
[52] U.S. Cl. ..................................... 350/96.11; 357/19
[58] Field of Search ............... 350/96.10, 96.11, 96.12, 350/96.14, 30 M; 357/40, 19; 250/227, 551

[56] References Cited

U.S. PATENT DOCUMENTS

| | | | |
|---|---|---|---|
| 2,982,883 | 5/1961 | Gordy | 361/414 X |
| 3,480,780 | 11/1969 | List et al. | 250/551 X |
| 3,535,532 | 10/1970 | Merryman | 357/40 |
| 3,912,353 | 10/1975 | Kasuya et al. | 361/415 X |
| 3,956,673 | 5/1976 | Seid | 361/415 X |
| 4,011,575 | 3/1977 | Groves | 361/400 X |
| 4,149,088 | 4/1979 | Lemelson | 250/551 |
| 4,274,104 | 6/1981 | Fang et al. | 357/19 |
| 4,354,115 | 10/1982 | Warabisako et al. | 357/19 |
| 4,355,321 | 10/1982 | Yeats | 350/96.14 X |
| 4,360,246 | 11/1982 | Figueroa et al. | 350/96.14 |
| 4,367,483 | 1/1983 | Takahashi et al. | 357/19 |
| 4,403,243 | 9/1983 | Hakamada | 350/96.21 |
| 4,533,833 | 8/1985 | Copeland | 357/19 X |
| 4,535,251 | 8/1985 | Herman et al. | 250/551 |

OTHER PUBLICATIONS

"Photo-Coupled Logic-a Hopeful Prospect" by D. A. Fraser (pp. 31-34).
"Coupling Light Sources to Fibers" by Mark L. Dakss, Laser Focus, Dec., 1975, pp. 31-34.
"Optical Waveguides Fabricated by Preferential Etching" by Won-Tien Tsang et al. Applied Optics, vol. 14, No. 5, May 1975 pp. 1200-1206.
"Optical Coupling from Fibers to Channel Waveguides Formed on Silicon" by J. T. Boyd and S. Sriram, Applied Optics, vol. 17, No. 6, 15 Mar. 1978 pp. 895-898.
"A Low Scattering Graded-Index SiO$_2$ Planar Optical Waveguide Thermally Grown on Silicon", by David E. Zelmon et al., Applied Physics Letters, vol. 42, No. 7, 1 Apr. 1983, pp. 665 and 666.
"GaAs Optical Electronic Devices for Signal Processing Application", by L. R. Tomesetta, SPIE vol. 176 Guided Wave Optical System and Devices II (1979), pp. 111 to 114.

Primary Examiner—Akm Ullah
Attorney, Agent, or Firm—James T. Comfort; Richard A. Stoltz; Melvin Sharp

[57] ABSTRACT

The disclosure relates to a complex circuit composed of a circuit board which is formed of crystalline elemental silicon in the form of a slice and circuit component in the form of semiconductor integrated circuits thereon which are preferably formed of a Group III-V compound. Signals from each of the integrated circuits are transmitted to other integrated circuits on the board or externally of the board either by conventional printed conductors on the board or, preferably, by means of a laser formed in each integrated circuit at each output terminal thereon which transmits light signals along light conducting members in the silicon board to photo responsive elements at the input locations on other ones of the integrated circuits on the board for external to the board. The light signal is transferred from an integrated circuit output to an integrated circuit input or to a device external to the board by means of light conducting members. These light conducting members may be light conducting rods positioned either on the surface of the board or in grooves formed therein. Alternatively, the light conducting members can be silicon dioxide paths formed in the silicon circuit board by selective oxidation of the silicon board to form silicon dioxide light conducting paths therein. Each light conducting path is coupled between a light emitting output from an integrated circuit and a light receiving input of another integrated circuit or travels to the edge of the circuit board for transmission external of the board.

33 Claims, 3 Drawing Sheets

SEMICONDUCTOR LAYER WITH OPTICAL COMMUNICATION BETWEEN CHIPS DISPOSED THEREIN

BACKGROUND OF THE INVENTION

1. Field of the Invention

This invention relates to a system for communication between semiconductor chips on a semiconductor substrate.

2. Description of the Prior Art

Prior art complex semiconductor circuits have often been constructed by use of plastic or ceramic circuit board having semiconductor packages mounted thereon with interconnection or communication between semiconductor packages taking place via conductors formed on the circuit board. Problems of heat dissipation and cross talk are minimized in such circuits by spreading out the components sufficiently on the circuit boards surface. It is also known in the prior art that, as the signal being communicated increases to a clock rate of over about 50 megahertz, the conductors on the printed circuit board begin to act as transmission lines and display capacitive and inductive properties. It is therefore necessary that appropriate measures be taken as in the case of transmission lines to obtain proper impedance matching to avoid reflections and the like. This problem is relatively minor and, in general, no particular attention was needed in the past if the check rate was below about 10 megahertz. However, with the continued emphasis in high speed operation of the components and with the increased miniaturization of the integrated circuit chips themselves and the desire for higher packing density on the printed circuit boards, the above noted problems become more and more of a bottleneck. For example, the number of pins entering and exiting integrated circuit packages is continually increasing due to the rapidly increasing number of components contained therein. This materially increases the problem of matching each pin and the path thereto or therefrom from reflections and other transmission line type problems. Furthermore, substantial heat will be generated in the input and output drivers, both from the increase in component packing density per chip as well as the increase in packing density of the chips on the printed circuit board.

SUMMARY OF THE INVENTION

In accordance with the present invention, the above noted problems of the prior art are substantially minimized and there is provided a complex circuit composed of a circuit board which is formed of elemental silicon in the form of a slice and circuit components in the form of semiconductor integrated circuits thereon which are preferably formed of a Group III-V compound. Signals from each of the integrated circuits are transmitted to other integrated circuits on the board or externally of the board either by conventional printed conductors on the board or, preferably, by means of a laser formed in each integrated circuit at each output terminal thereon which transmits light signals along light conducting members in the silicon board to photo responsive elements at the input locations on other ones of the integrated circuits on the board for external to the board. It is therefore readily seen that each light emitting output will be composed preferably of a laser diode or the like and each input member will be composed preferably of a photo responsive diode or the like.

The light signal is transferred from an integrated circuit output to an integrated circuit input or to a device external to the board by means of light conducting members. These light conducting members may be light conducting rods positioned either on the surface of the board or in grooves formed therein. Alternatively, the light conducting members can be silicon dioxide paths formed in the silicon circuit board by selective oxidation of the silicon board to form silicon dioxide light conducting paths therein. Each light conducting path will be coupled between a light emitting output from an integrated circuit and a light receiving input of another integrated circuit or travel to the edge of the circuit board for transmission external of the board. The transmission of light frequencies between circuit boards or the like permits replacement of a single light channel for what would be required of a many pinned device and connector and eliminates the problems caused thereby as noted hereinabove as well as eliminating the driver circuits required to provide sufficient power for communication between circuit boards in prior art standard non-light frequency applications.

The light conducting member will be coupled to the light emitting member and the light receiving member of the integrated circuits by standard coupling means such as a light conducting epoxy or the like as are well known in the art. Such coupling techniques are shown in "Photo-Coupled Logic—A Hopeful Prospect", by D. A. Fraser pages 31 to 34; "Coupling Light Sources to Fibers" by Mark L. Dakss, Laser Focus, December, 1975, pages 31 to 34; Optical Waveguides Fabricated by Preferential Etching" by Won-Tien Tsang, Cheng-Chung Tseng, and Shyh Wang, Applied Optics, Vol. 14, No. 5, May, 1975, pages 1200 to 1206; "Optical Coupling From Fibers to Channel Waveguides Formed on Silicon" by J. T. Boyd and S. Sriram, Applied Optics, Vol. 17, No. 6, 15 March 1978, pages 895 to 898; "A Low-Scattering Graded-Index $SiO_2$ Planar Optical Waveguide Thermally Grown on Silicon", by David E. Zelmon et al, Applied Physics Letters, Vol. 42, No. 7, 1 April 1983, pages 665 and 666; and "GaAs Optical Electronic Devices for Signal Processing Application", by L. R. Tomesetta, SPIE Vol. 176 Guided Wave Optical Systems and Devices II (1979), pages 111 to 114, all of which are incorporated herein by reference.

DESCRIPTION OF THE PREFERRED EMBODIMENT

Figure 1:
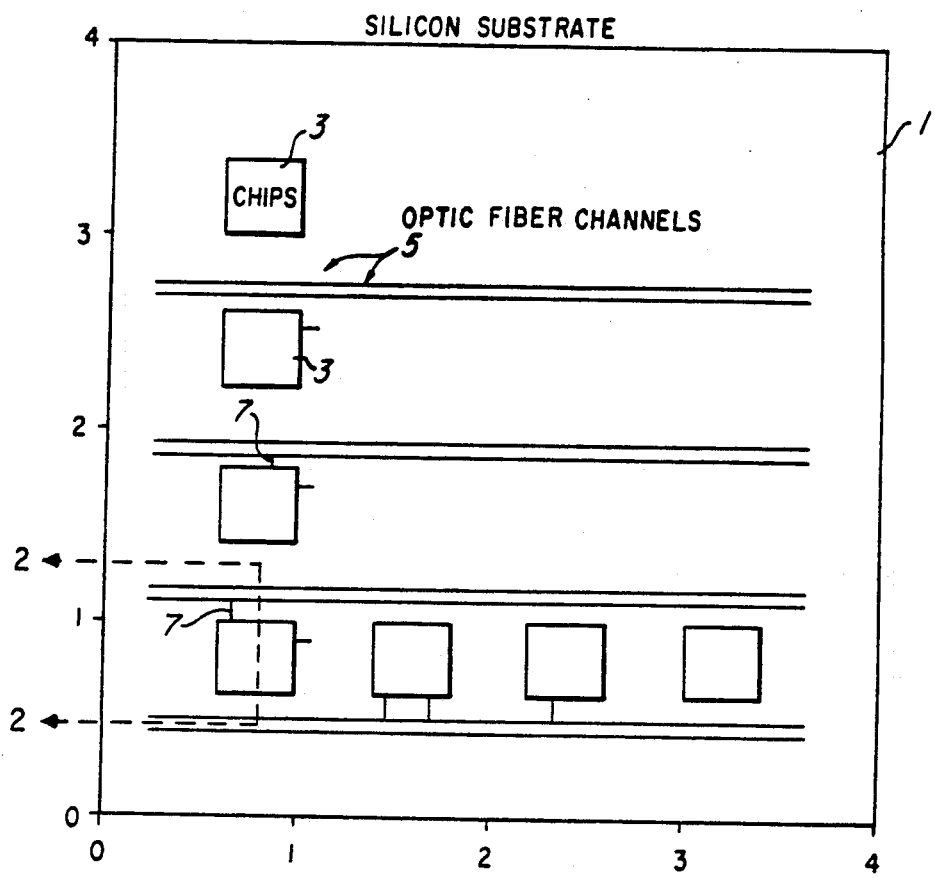
FIG. 1 is a top view of a complex electronic circuit in accordance with the present invention.
Figure 2:
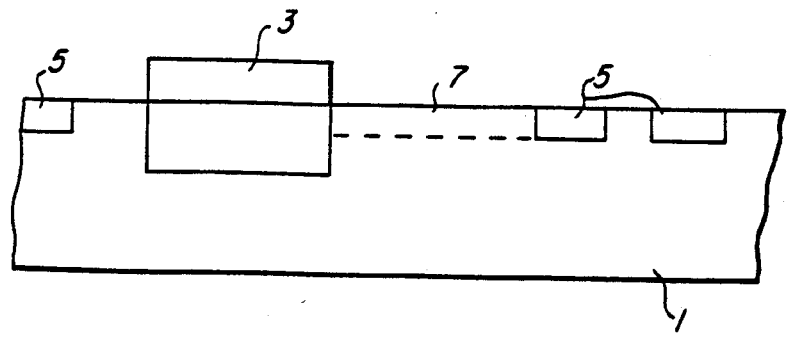
FIG. 2 is a view taken along the line 2—2 of FIG. 1.
Figure 3:
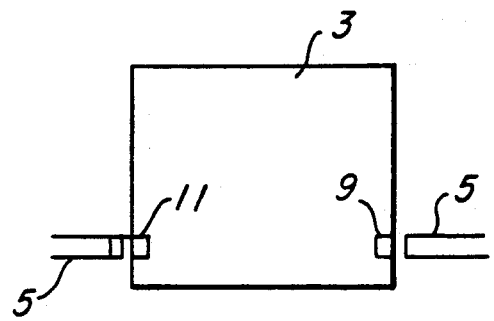
FIG. 3 is a schematic diagram of a chip optically coupled to a p a i r of optical channels via a laser a nd a phototransistor.

Referring now to FIGS. 1 and 2, there is shown a circuit board 1 formed of a silicon slice and having positioned thereon a plurality of semiconductor chips 3 preferably formed from a Group III-V material, which are secured to the top surface of the board 1 by appropriate bonding techniques. A plurality of fiber optic channels 5 are formed in or on the board in a manner to be described in more detail hereinbelow. Coupling elements 7 couple outputs 9 (FIG. 3) from the chip 3 to optic fiber channels 5 and also couple the optic fiber channels 5 to inputs 11 (FIG. 3) to the chips 3. Each of the chips 3 has either or both of a light emitting output element 9 which can be in the form of a laser diode which is coupled to one of the optic fiber channels 5 as shown in FIG. 3 and an input element 11, preferably in the form of a photo responsive diode which is also coupled to an optic fiber channel 5. The optical fiber channels 5 as shown in FIG. 3 also provide communication between plural circuit boards or a circuit board and an external optical transmitter and/or receiver.

The fiber optic channel 5 can be formed in several ways. In accordance with the first embodiment, grooves are formed in the upper surface of the circuit board 1 and standard fiber optic elements 5 are deposited and secured therein. When such standard fiber optic elements are utilized, the material from which the circuit board is formed need not be silicon but can be any standard board material. As a second alternative, the circuit board 1 will be of crystalline silicon and the optic fiber channels 5 are formed therein by standard semiconductor oxidation techniques wherein, for example, a silicon nitride pattern will be formed on the surface of the board 1 and the board will then either be etched in the regions where the optic fiber channels are to be formed with subsequent oxidation of the exposed silicon to fill the channel with silicon dioxide or, alternatively, after pattern formation with silicon nitride, the exposed silicon will be oxidized with subsequent optional etching back of the silicon oxide formed to an appropriate level if desired or required. The silicon dioxide formed by oxidation of the silicon board will act as an optic fiber channel and will have light conducting properties as is shown in the above mentioned publications.

The semiconductor chips 3 will preferably be formed from a Group III-V compound, preferably gallium arsenide, so that, in addition to circuit components, either one or more laser diodes 9 or light responsive devices 11 or both can be formed in each of the chips to permit communication both into and out of each chip to provide the I/O terminals therefore. It should be understood that each chip can have a plurality of optical output devices 9 and/or a plurality of optical input devices 11.

It is readily apparent that, since each of the optical fiber channels or conductors 5 is a transmitter of light, and since light signals can go up to about 2 GHz bandwidth, it is possible to replace, for example, 10 electrical signal paths by one light conductor 5, each with a 200 MHz signal bandwidth. It is therefore apparent that, since plural different signals can be placed on the same line, an equivalent number of input and/or output terminals can be eliminated physically from the chip itself, thereby materially decreasing the space requirement. In addition, since optical signals are being utilized, there is no problem of impedance matching or other problems resulting from the use of high frequencies. Furthermore, since the light is confined to the optical fiber or guide, there will be no cross talk across channels. Also, the problem of heat generation is substantially minimized by the use of optical transmissions.

Figure 4:
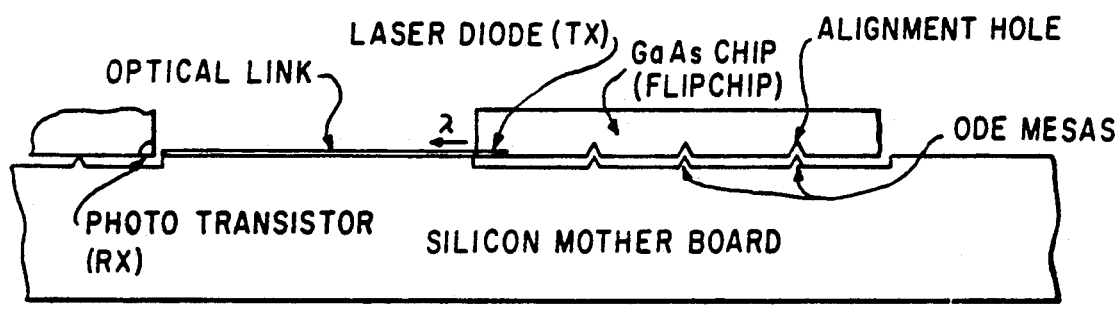
FIG. 4 is a schematic diagram of a circuit in accordance with a further embodiment of the invention.

Referring now to FIG. 4, there is shown a further embodiment of the invention. In FIG. 4, there is shown a silicon circuit board 21 having mesas 23 formed in selected regions on the surface thereof which line up with alignment holes 25 formed on the surface of a gallium arsenide chip 27 of the type known in the art as a "flipchip". The mesas 23 are formed by standard well known orientation dependent etchants (ODE) to provide the desired mesa shape. The chip 27 includes a laser diode 29 which is lined up with an optical link 31 on the surface of the board 21 due to the selective formation of the mesas 23 to provide the alinement. The optical link 31 can be an optical fiber placed in a groove formed in the board 21 or on the surface of the board 21 or can be an $SiO_2$ path formed in the board in the manner described hereinabove and in the above noted publications. Also shown is a further chip 33 positioned over mesas 35 which are the same as mesas 23 having a phototransistor 37 lined up with the optical link 31. Information at optical frequencies is transmitted from laser 29 to phototransistor 37 via optical link 31. In the above described embodiment, the ODE mesas 23 are coupled to pads on the chips 27 and 33 to provide a voltage source, ground connection and as a signal input and output as well as for alignment as noted above.

Figure 5:
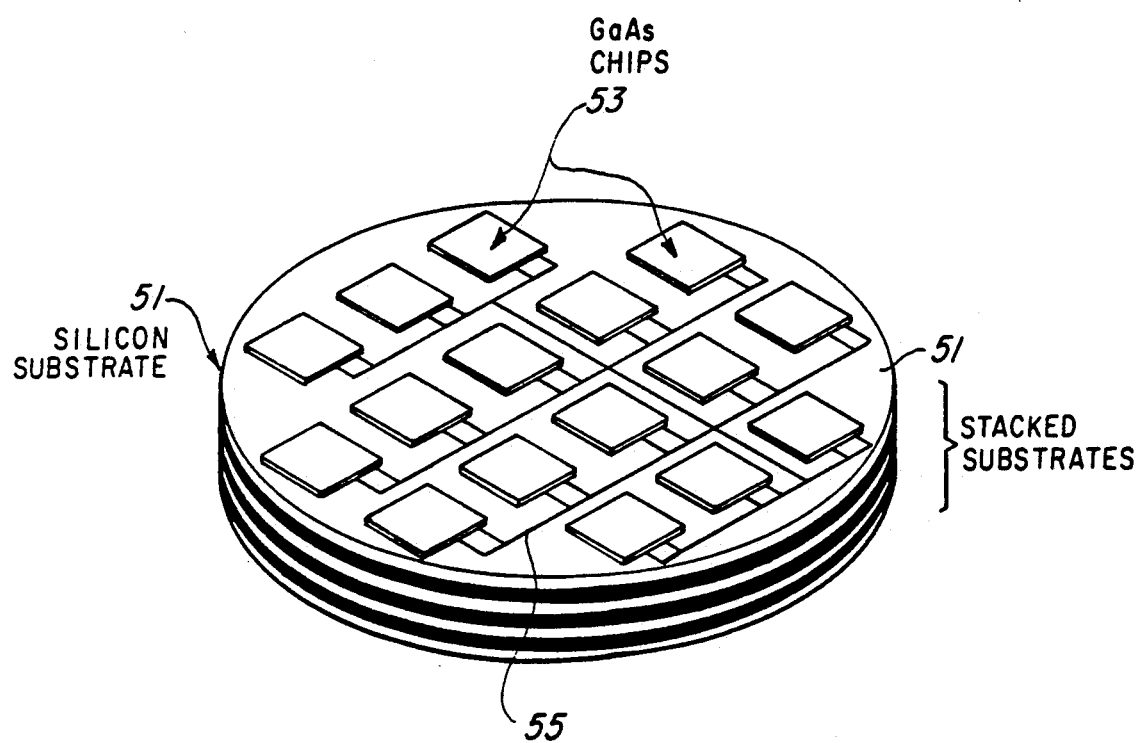
FIG. 5 is a schematic diagram of a plurality of stacked circuits in accordance with the present invention.

Boards of the type shown in FIGS. 1 to 4 can be stacked as shown in FIG. 5. Communication among the stacked boards can be by electrical connection in standard manner and/or by running optical links from board to board. As shown in FIG. 5, four boards 51 are stacked, one atop the other. Gallium arsenide chips 53 are positioned on the boards and interconnected on each board 51 by optical links 55. Optical fibers (not shown) travel between optical links 55 from any board 51 to and optical link on a further board 51 to provide optical communication between boards.

Briefly, to recapitulate, it is posible in accordance with the present invention to provide chip to chip communication on a single circuit board wherein the board itself is preferably a silicon substrate, wherein the optical fibers are formed in the board itself by standard integrated circuit processing techniques and wherein Group III-V semiconductor devices are utilized for transmitting and receiving the optical signals transmitted via the circuit board itself.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. An optical communication system which comprises:
   (a) support means of semiconductor material having a surface;
   (b) optical frequency signal transmission means disposed within and forming a part of said support means and extending to said surface;
   (c) a first semiconductor element having an optical frequency signal transmitter disposed at the surface of said support and optically coupled to said transmission means; and
   (d) a second semiconductor element having an optical frequency signal receiver disposed at the surface of said support and optically coupled to said transmission means.

2. An optical communication system as set forth in claim 1 wherein said first semiconductor device is formed from a Group III-V material.

3. An optical communication system as set forth in claim 2 wherein said transmission means is a silicon oxide path.

4. An optical communication system as set forth in claim 2 further including a plurality of mesas formed in the surface of said support, said first and second semiconductor chip being disposed on predetermined ones of said means.

5. An optical communication system as set forth in claim 4 wherein each of said semiconductor chips includes conductive pads thereon contacting said means, said means being electrically conductive.

6. An optical communication system as set forth in claim 3 further including a plurality of mesas formed in the surface of said support, said first and second semiconductor chip being disposed on predetermined ones of said means.

7. An optical communication system as set forth in claim 6 wherein each of said semiconductor chips includes conductive pads thereon contacting said mesas, said mesas being electrically conductive.

8. The system of claim 3 wherein said support means is crystalline silicon.

9. The system of claim 2 wherein said support means is crystalline silicon.

10. An optical communication system as set forth in claim 2 wherein said Group III-V material is gallium arsenide.

11. An optical communication system as set forth in claim 10 wherein said transmission means is a silicon oxide path.

12. An optical communication system as set forth in claim 10 further including a plurality of mesas formed in the surface of said support, said first and second semiconductor chip being disposed on predetermined ones of said mesas.

13. An optical communication system as set forth in claim 12 wherein each of said semiconductor chips includes conductive pads thereon contacting said mesas, said means being electrically conductive.

14. An optical communication system as set forth in claim 11 further including a plurality of mesas formed in the surface of said support, said first and second semiconductor chip being disposed on predetermined ones of said mesas.

15. An optical communication system as set forth in claim 14 wherein each of said semiconductor chips includes conductive pads thereon contacting said mesas, said mesas being electrically conductive.

16. The system of claim 9 wherein said support means is crystalline silicone.

17. The system of claim 3 wherein said support means is crystalline silicon.

18. An optical communication system as set forth in claim 1 wherein said transmission means is a silicon oxide path.

19. An optical communication system as set forth in claim 18 further including a plurality of mesas formed in the surface of said support, said first and second semiconductor chip being disposed on predetermined ones of said mesas.

20. An optical communication system as set forth in claim 19 wherein each of said semiconductor chips includes conductive pads thereon contacting said mesas, said mesas being electrically conductive.

21. The system of claim 7 wherein said support means is crystalline silicon.

22. The system of claim 1 wherein said support means is crystalline silicon.

23. An optical communication system which comprises:
   (a) support means having a substantially planar surface;
   (b) optical frequency signal transmission means disposed on said surface;
   (c) a first semiconductor element having an optical frequency signal transmitter disposed on said support and optically coupled to said transmission means; and
   (d) a second semiconductor element having an optical frequency signal receiver disposed on said support and optically coupled to said transmission means;
   (e) further including a plurality of means disposed at the surface of said support, said first and second semiconductor chips being disposed on predetermined ones of said mesas.

24. An optical communication system as set forth in claim 23 wherein each of said semiconductor chips includes conductive pads thereon contacting said mesas, said mesas being electrically conductive.

25. An optical communication system as set forth in claim 23 wherein said first semiconductor device is formed from a Group III-V material.

26. An optical communication system as set forth in claim 25 wherein said Group III-V material is gallium arsenide.

27. An optical communication system as set forth in claim 26 wherein said transmission means is a silicon oxide path formed from said support means.

28. An optical communication system as set forth in claim 27 wherein each of said semiconductor chips includes conductive pads thereon contacting said mesas, said mesas being electrically conductive.

29. An optical communication system as set forth in claim 25 wherein said transmission means is a silicon oxide path formed from said support means.

30. An optical communication system as set forth in claim 29 wherein each of said semiconductor chips includes conductive pads thereon contacting said mesas, said mesas being electrically conductive.

31. An optical communication system as set forth in claim 23 wherein said transmission means is a silicon oxide path formed from said support means.

32. An optical communication system as set forth in claim 31 wherein each of said semiconductor chips includes conductive pads thereon contacting said means, said means being electrically conductive.

33. An optical communication system which comprises:
   (a) support means of semiconductor material having a substantially planar surface;
   (b) optical frequency signal transmission means disposed within and forming a part of said support means and extending to said surface;
   (c) a first semiconductor chip having optical frequency transmitting capability disposed on said support and coplanar with and optically coupled to said transmission means; and
   (d) a second semiconductor chip having optical frequency receiving capability disposed on said support means and coplanar with and optically coupled to said transmission means.

* * * * *